United States Patent
Wu et al.

(10) Patent No.: US 8,508,400 B2
(45) Date of Patent: Aug. 13, 2013

(54) SUCCESSIVE APPROXIMATION REGISTER ANALOG TO DIGITAL CONVERTER AND CONVERSION METHOD THEREOF

(75) Inventors: Meng Hsuan Wu, Taipei (TW); Yung-Hui Chung, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 13/479,021

(22) Filed: May 23, 2012

(65) Prior Publication Data

US 2012/0326900 A1 Dec. 27, 2012

Related U.S. Application Data

(60) Provisional application No. 61/500,911, filed on Jun. 24, 2011, provisional application No. 61/504,541, filed on Jul. 5, 2011.

(51) Int. Cl.
*H03M 1/12* (2006.01)

(52) U.S. Cl.
USPC ............ 341/172; 341/118; 341/120; 341/155

(58) Field of Classification Search
USPC .................... 341/118, 120, 155, 172
See application file for complete search history.

(56) References Cited

U.S. PATENT DOCUMENTS

| | | | | |
|---|---|---|---|---|
| 5,138,319 A * | 8/1992 | Tesch | ............................. | 341/156 |
| 7,456,768 B2 * | 11/2008 | La Rue et al. | .................. | 341/141 |
| 7,746,262 B2 * | 6/2010 | Chowdhury et al. | ......... | 341/163 |
| 7,834,796 B2 * | 11/2010 | Xu et al. | ........................ | 341/172 |
| 8,004,447 B2 * | 8/2011 | Hsu | ............... | 341/161 |
| 8,310,388 B2 * | 11/2012 | Chang et al. | ................... | 341/156 |
| 2003/0231130 A1 * | 12/2003 | Confalonieri et al. | ......... | 341/172 |
| 2007/0139243 A1 * | 6/2007 | Chowdhury et al. | ......... | 341/155 |
| 2009/0273501 A1 * | 11/2009 | Madhavan et al. | ............. | 341/158 |
| 2013/0076546 A1 * | 3/2013 | Wan et al. | ...................... | 341/120 |

OTHER PUBLICATIONS

Shrivastava, A.; "12-Bit Non-Calibrating Noise-Immune Redundant SAR ADC for System-On-a-Chip;" IEEE; 2006; pp. 1515-1518.
Liu, W., et al.; "A 12b 22.5/45MS/s 3.0mW 0.059mm2 CMOS SAR ADC Achieving Over 90dB SFDR;" International Solid-State Circuits Conference; Session 21; 2010; pp. 380-382.

* cited by examiner

*Primary Examiner* — Linh Nguyen
(74) *Attorney, Agent, or Firm* — McClure, Qualey & Rodack, LLP

(57) ABSTRACT

A SAR ADC is provided. A DAC provides an intermediate analog signal according to an analog input signal, a most significant bit capacitance and a plurality of significant bit capacitances smaller than the most significant bit capacitance. A first switched capacitor array selectively provides the most significant bit capacitance or the significant bit capacitances according to a select signal. Sum of the significant bit capacitances is equal to the most significant bit capacitance. The second switched capacitor array provides the significant bit capacitances when the first switched capacitor array provides the most significant bit capacitance, and provides the most significant bit capacitance when the first switched capacitor array provides the significant bit capacitances. A comparator provides a comparison result according to the intermediate analog signal. A SAR logic provides an digital output signal according to the comparison result.

17 Claims, 8 Drawing Sheets

SUCCESSIVE APPROXIMATION REGISTER ANALOG TO DIGITAL CONVERTER AND CONVERSION METHOD THEREOF

CROSS REFERENCE TO RELATED APPLICATIONS

This Application claims priority of U.S. Provisional Application No. 61/500,911, filed on Jun. 24, 2011, and U.S. Provisional Application No. 61/504,541, filed Jul. 5, 2011, the entirety of which are incorporated by reference herein.

BACKGROUND OF THE INVENTION

1. Field of the Invention

The invention relates to an analog to digital converter (ADC), and more particularly to an ADC that uses successive approximation techniques.

2. Description of the Related Art

Currently, analog to digital converters (ADCs) are widely used in a variety of applications, such as medical systems, audio systems, test and measurement equipment, communication systems, and image and video systems, etc. The most common ADC construction comprises flash ADCs, pipeline ADCs and successive approximation register (SAR) ADCs. Although the flash ADC and the pipeline ADC are faster than the SAR ADC, their power consumption is also larger, and are not suitable for many systems with limited power supply, such as portable devices.

Types of the SAR ADCs comprise resistor string SAR ADCs which use resistive digital to analog converters (RDACs), capacitor array SAR ADCs which use capacitive digital to analog converters (CDACs), and resistor-capacitor (R-C) hybrid SAR ADCs which use hybrid DACs (i.e. C+R DACs). In general, the capacitor array SAR ADC has better linearity than the resistor string SAR ADC. Furthermore, the R-C hybrid SAR ADC is often used to reduce area due to lengthy resistor strings or bulky capacitor arrays when physically laid out. However, large capacitance is required due to limitations in semiconductor processes, thus sacrificing area and increasing power consumption.

For the SAR ADCs, middle-code transition is the major cause of nonlinearity due to capacitor mismatch in the CDAC or hybrid DAC. Therefore, it is desired to improve linearity without increasing capacitances for the SAR ADCs.

BRIEF SUMMARY OF THE INVENTION

A successive approximation register (SAR) analog to digital converter (ADC) for converting an analog input signal into a digital output signal and a conversion method thereof are provided. An embodiment of a successive approximation register (SAR) analog to digital converter (ADC) for converting an analog input signal into a digital output signal, comprises: a digital to analog converter, having an input terminal for receiving the analog input signal and an output terminal for providing an intermediate analog signal according to the analog input signal, a most significant bit capacitance and a plurality of significant bit capacitances smaller than the most significant bit capacitance, and comprising: a first switched capacitor array coupled to the input and output terminals of the digital to analog converter, selectively providing the most significant bit capacitance or the significant bit capacitances according to a select signal, wherein the sum of the significant bit capacitances is equal to the most significant bit capacitance; and a second switched capacitor array coupled to the input and output terminals of the digital to analog converter, providing the significant bit capacitances when the first switched capacitor array provides the most significant bit capacitance, and providing the most significant bit capacitance when the first switched capacitor array provides the significant bit capacitances; a comparator, providing a comparison result according to the intermediate analog signal; and a SAR logic, providing the digital output signal according to the comparison result.

Furthermore, an embodiment of a conversion method for a successive approximation register (SAR) analog to digital converter (ADC) having a digital to analog converter and a SAR logic is provided. A first switched capacitor array of the digital to analog converter selectively provides a most significant bit capacitance or a plurality of significant bit capacitances smaller than the most significant bit capacitance according to a select signal. A second switched capacitor array of the digital to analog converter provides the most significant bit capacitance when the significant bit capacitances are provided by the first switched capacitor array. The second switched capacitor array provides the significant bit capacitances when the most significant bit capacitance is provided by the first switched capacitor array. An intermediate analog signal is obtained according to a reference signal, an analog input signal, the most significant bit capacitance and the significant bit capacitances. A comparison result is provided according to the intermediate analog signal. The SAR logic provides a digital output signal according to the comparison result.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
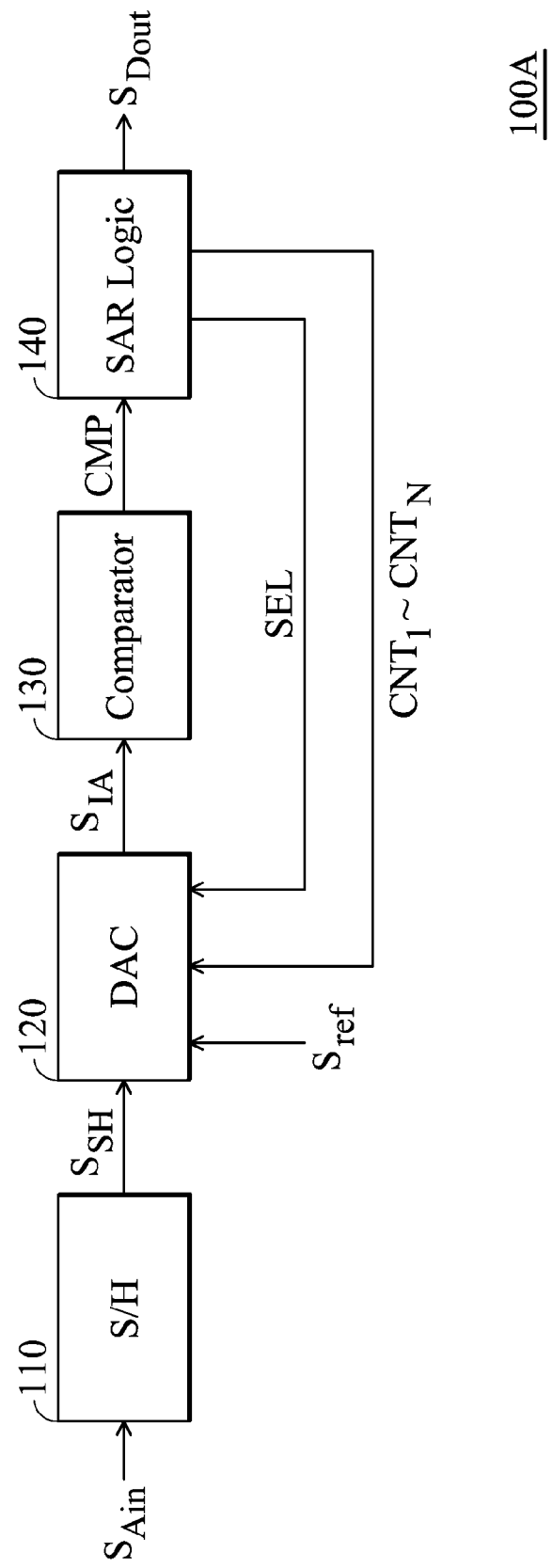
FIG. 1A shows a bottom-plate sampling successive approximation register (SAR) analog to digital converter (ADC) according to an embodiment of the invention.

FIG. 1A shows a bottom-plate sampling successive approximation register (SAR) analog to digital converter (ADC) 100A according to an embodiment of the invention. The SAR ADC 100A generates a digital output signal $S_{Dout}$ representative of the strength of an analog input signal $S_{Ain}$ (at a sampled time instance) through a binary search process through all possible quantization levels. The SAR ADC 100A comprises a sample and hold circuit 110, a digital to analog converter (DAC) 120, a comparator 130 and a SAR logic 140. The sample and hold circuit 110 samples the analog input signal $S_{Ain}$ to obtain a sampled analog signal $S_{SH}$. The DAC 120 generates an intermediate analog signal $S_{IA}$ according to the sampled analog signal $S_{SH}$, a reference signal $S_{ref}$, a select signal SEL and a plurality of control signals $CNT_1$ to $CNT_N$. In one embodiment, the DAC 120 may generate the intermediate analog signal $S_{IA}$ further according to a plurality of reference signals (e.g. $S_{ref+}$ and $S_{ref-}$) and a common signal ($V_{CM}$). The comparator 130 provides a comparison result CMP according to the intermediate analog signal $S_{IA}$. The SAR logic 140 provides the digital output signal $S_{Dout}$ according to the comparison result CMP. Furthermore, the SAR logic 140 further provides the control signals $CNT_1$ to $CNT_N$ to the DAC 120 according to the comparison result CMP. In the embodiment, the SAR logic 140 provides the select signal SEL to the DAC 120 to perform a capacitor swapping operation, wherein details of execution of the capacitor swapping operation are described below. In the embodiment, the DAC 120 is a capacitive DAC or a hybrid DAC (C+R DAC).

In the SAR ADC 100A, each bit of the digital output signal $S_{Dout}$ is determined by the SAR logic 140 during a sampling period of the sample and hold circuit 110, starting from a most significant bit (MSB). For example, to determine the most significant bit, the SAR logic 140 sets the most significant bit control signal $CNT_1$ to a specific logical value (e.g. "1"), and the SAR logic 140 simultaneously sets the other significant control signals $CNT_2$ to $CNT_N$ to the other logical value (e.g. "0"), and then the DAC 120 generates the intermediate analog signal $S_{IA}$ in response to the control signals $CNT_1$ to $CNT_N$. Assuming the specific logical value equals "1", the value of the most significant bit of the digital output signal $S_{Dout}$ is determined to equal "0" by the SAR logic 140 when the comparison result CMP indicates that the sampled analog signal $S_{SH}$ is smaller than the intermediate analog signal $S_{IA}$, or else to "1". After the most significant bit of the digital output signal $S_{Dout}$ is determined, the SAR logic 140 sets the next significant control signal $CNT_2$ to "1" and sets the following significant control signals $CNT_3$ to $CNT_N$ to "0", and then the DAC 120 generates a new intermediate analog signal $S_{IA}$. Similarly, the SAR logic 140 determines the next significant bit of the digital output signal $S_{Dout}$ according to a new comparison result CMP. The approach is continued until all the bits of the digital output signal $S_{Dout}$ are determined.

Figure 1B:
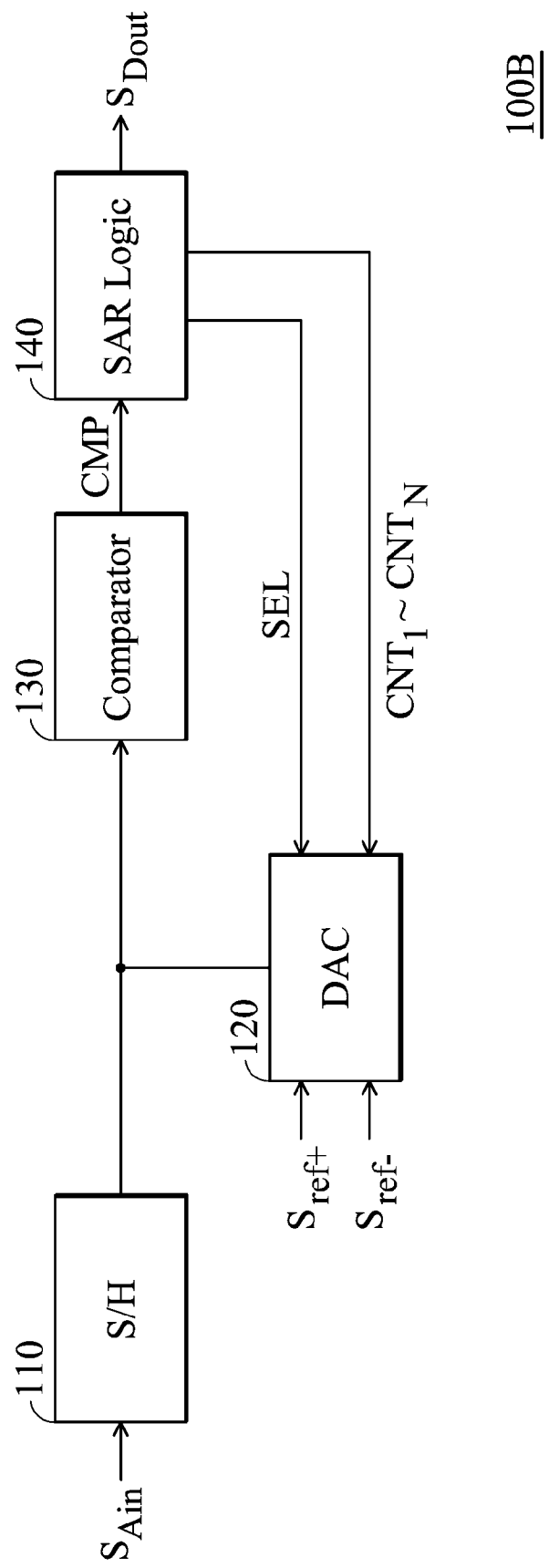
FIG. 1B shows a top-plate sampling SAR ADC according to an embodiment of the invention.

FIG. 1B shows a top-plate sampling SAR ADC 100B according to an embodiment of the invention. Similarly, according to the sampled analog signal $S_{SH}$ from the sample and hold circuit 110, the reference signals $S_{ref+}$ and $S_{ref-}$, a select signal SEL and a plurality of control signals $CNT_1$ to $CNT_N$, the DAC 120 generates the intermediate analog signal $S_{IA}$ to the comparator 130.

Figure 2A:
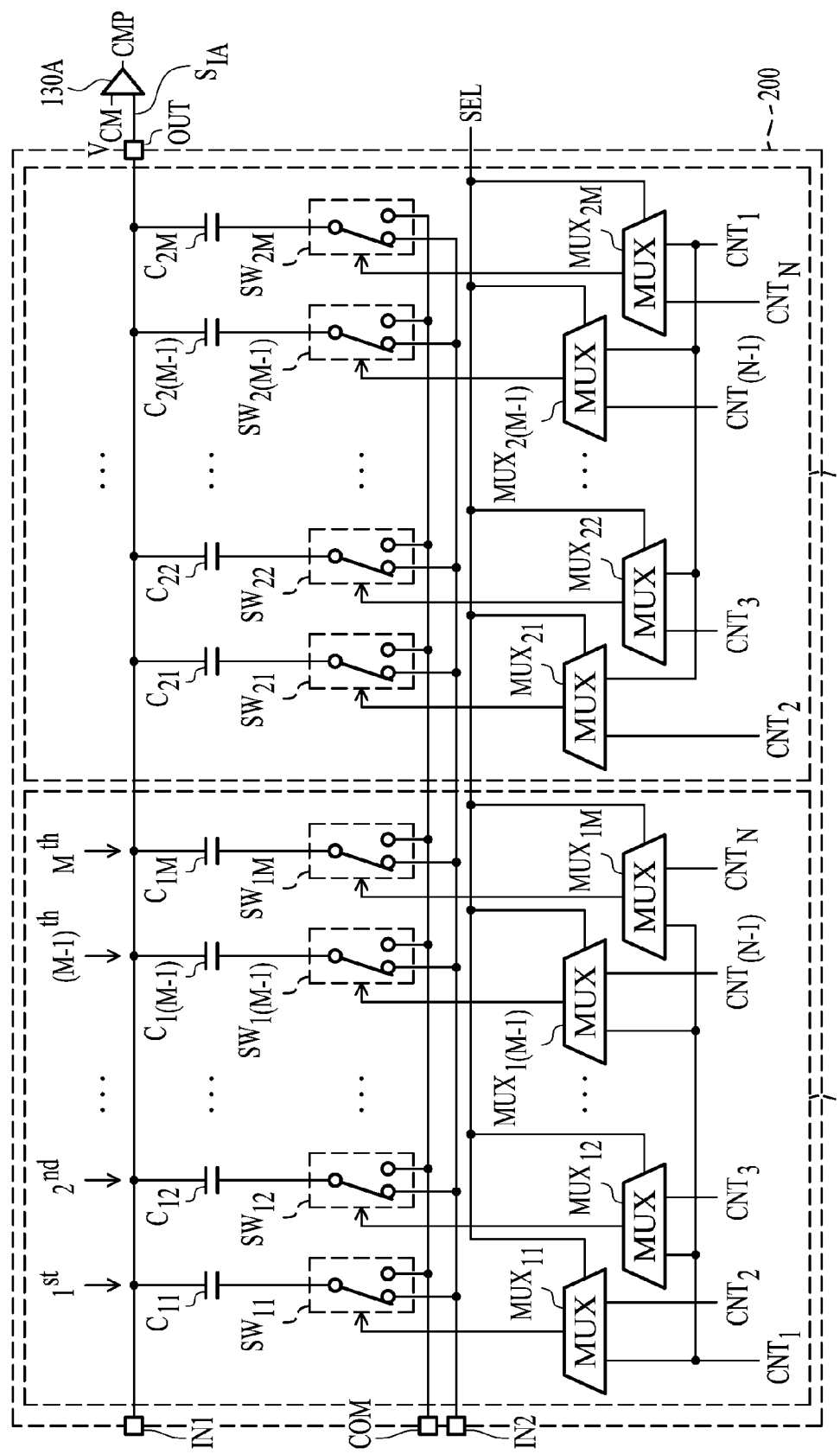
FIG. 2A shows an M-bit capacitive DAC for the top-plate sampling SAR ADC of FIG. 1B according to an embodiment of the invention.

FIG. 2A shows a binary weighted M-bit capacitive DAC 200 for the top-plate sampling SAR ADC 100B of FIG. 1B according to an embodiment of the invention. In FIG. 2A, the DAC 200 is implemented to process single ended signals received by the input terminals IN1 and IN2. The DAC 200 comprises two switched capacitor arrays 210 and 220. The switched capacitor arrays 210 and 220 connected in parallel have the same circuit structures, and each of the switched capacitor arrays 210 and 220 comprises a plurality of branches, wherein each branch is coupled to the input terminals IN1 and IN2 of the DAC 200. Taking the switched capacitor array 210 as an illustration, the switched capacitor array 210 comprises M branches that form an array of binary-weighted capacitors, and each branch comprises a capacitor with an individual capacitance, a switch coupled to the capacitor in cascade, and a multiplexer (MUX) for controlling the switch. For example, in the $1^{st}$ branch of the switched capacitor array 210, the capacitor $C_{11}$ is coupled between the input terminal IN1 and the switch $SW_{11}$, and the switch $SW_{11}$ is coupled to the capacitor $C_{11}$, the input terminal IN2 and a common terminal COM, wherein the multiplexer $MUX_{11}$ provides the control signal $CNT_2$ or $CNT_1$ to control the switch $SW_{11}$ according to the select signal SEL. According to the control signal from the multiplexer $MUX_{11}$, the switch $SW_{11}$ selectively couples the capacitor $C_{11}$ to the input terminal IN2 or the common terminal COM. Furthermore, in the $M^{th}$ branch of the switched capacitor array 210, the capacitor $C_{1M}$ is coupled between the input terminal IN1 and the switch $SW_{1M}$, and the switch $SW_{1M}$ is coupled to the capacitor $C_{1M}$ and the input terminal IN2 and the common terminal COM, wherein the multiplexer $MUX_{1M}$ provides the control signal $CNT_N$ or $CNT_1$ to control the switch $SW_{1M}$ according to the select signal SEL, where N=M+1. According to the control signal from the multiplexer $MUX_{1M}$, the switch $SW_{1M}$ selectively couples the capacitor $C_{1M}$ to the input terminal IN2 or the common terminal COM. Moreover, the capacitors $C_{11}$ to $C_{1M}$ are the binary-weighted capacitors, i.e. $C_{11}=2C_{12}$, $C_{12}=2C_{13}, \ldots, C_{1(M-2)}=2C_{1(M-1)}$ and $C_{1(M-1)}=C_{1M}$, and the sum of the capacitors $C_{11}$ to $C_{1M}$ is equal to a most significant bit capacitance of the DAC 200. Similarly, the sum of the capacitors $C_{21}$ to $C_{12M}$ of the switched capacitor array 220 is also equal to the most significant bit capacitance of the DAC 200.

Referring to FIG. 1B and FIG. 2A together, the input terminal IN1 is used to receive the sampled analog signal $S_{SH}$ and the input terminal IN2 is used to receive the reference signal $S_{ref+}$. Furthermore, the common terminal COM is used to receive a reference voltage $S_{ref-}$ different from the reference signal $S_{ref+}$. The SAR logic 140 provides the control signals $CNT_1$ to $CNT_N$ to control the switched capacitor arrays 210 and 220 of the DAC 200, so as to switch the corresponding capacitors and obtain the intermediate analog signal $S_{IA}$ at an output terminal OUT. Therefore, a comparator 130A obtains the comparison result CMP according to the intermediate analog signal $S_{IA}$ and a common signal $V_{CM}$. The reference signals $S_{ref+}$ and $S_{ref-}$ and the common signal $V_{CM}$ are determined according to the switching algorithm of the DAC 200.

Figure 2B:
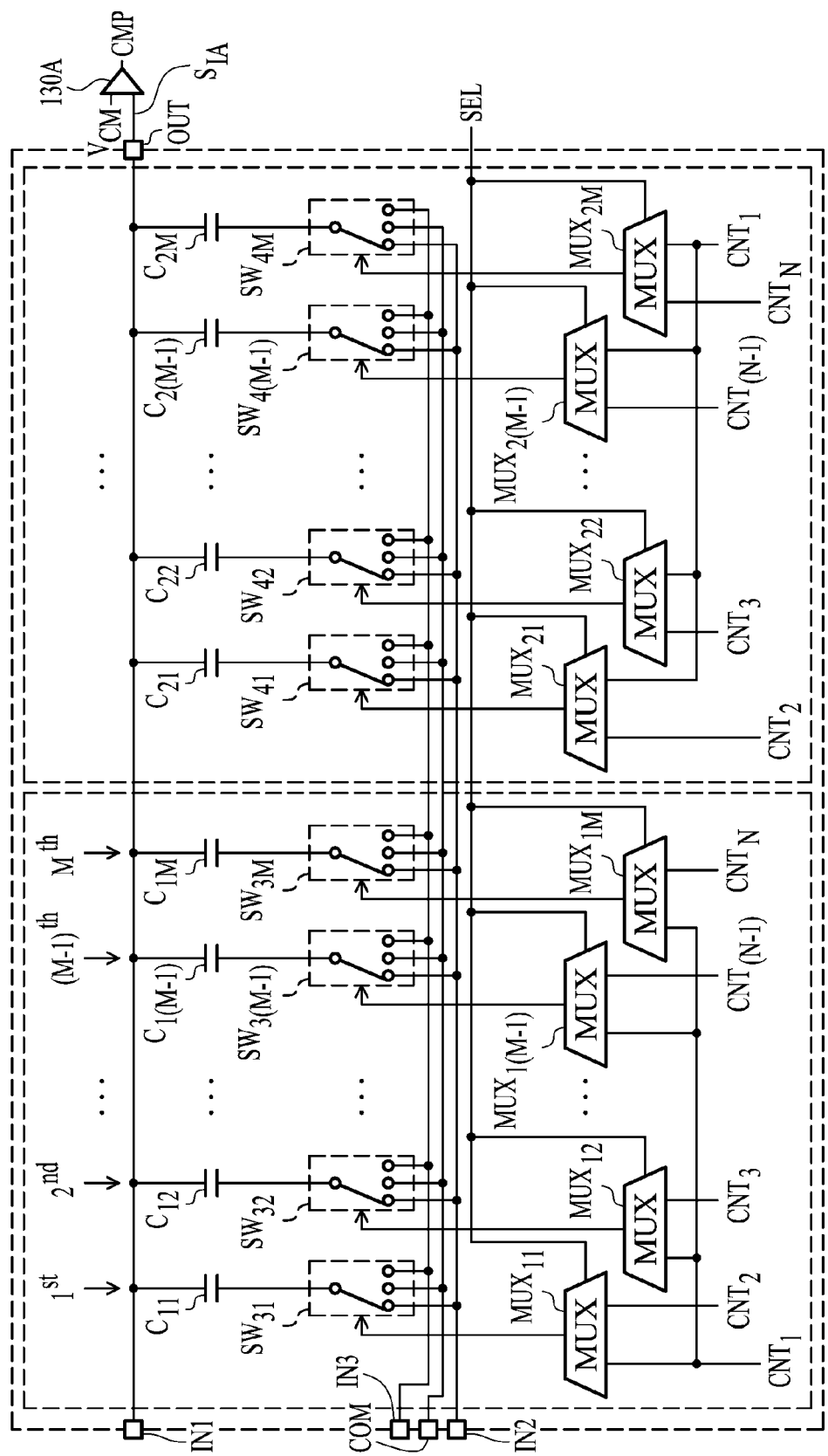
FIG. 2B shows an M-bit capacitive DAC for the bottom-plate sampling SAR ADC of FIG. 1A according to an embodiment of the invention.

FIG. 2B shows an M-bit capacitive DAC for the bottom-plate sampling SAR ADC 100A of FIG. 1A according to an embodiment of the invention. In the embodiment, each of the switches $SW_{31}$-$SW_{3M}$ and $SW_{41}$-$SW_{4M}$ is a three terminal switch, wherein the input terminal IN2 is used to receive the reference signal $S_{ref+}$, the common terminal COM is used to receive a reference voltage $S_{ref-}$, and the input terminal IN3 is used to receive the sampled analog signal $S_{SH}$. Furthermore, the input terminal IN1 is used to receive the common signal $V_{CM}$.

Figure 3:
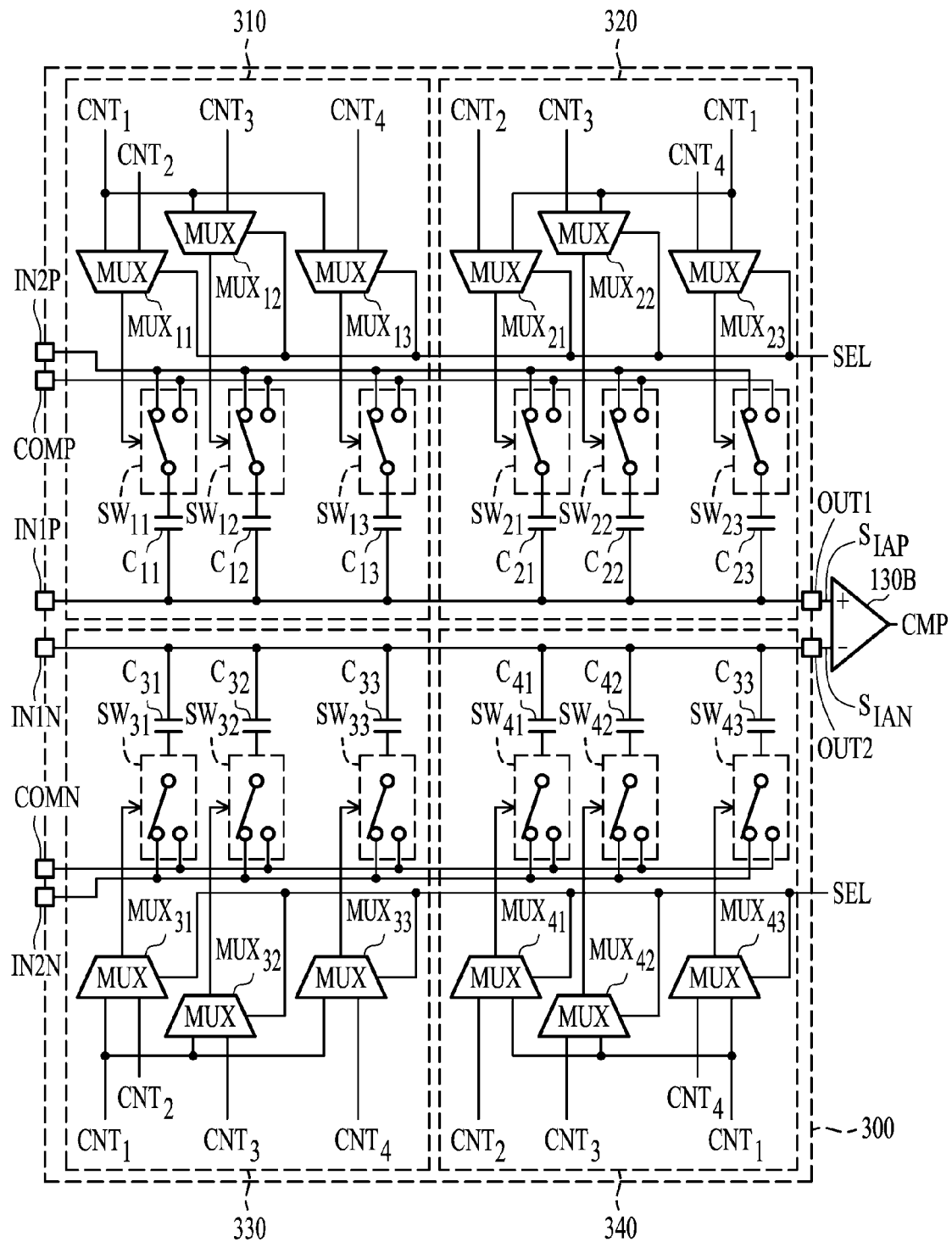
FIG. 3 shows a 3-bit capacitive DAC according to an embodiment of the invention.

FIG. 3 shows a 3-bit capacitive DAC 300 according to an embodiment of the invention. In FIG. 3, the DAC 300 is implemented to process differential signals received by the input terminals IN1P/IN1N and the input terminals IN2P/IN2N. The DAC 300 comprises four switched capacitor arrays 310, 320, 330 and 340. An inverting input terminal of a comparator 130B is coupled to an output terminal OUT2 of the DAC 300, and a non-inverting input terminal of the comparator 130B is coupled to an output terminal OUT1 of the DAC 300. The four switched capacitor arrays 310, 320, 330 and 340 have the same circuit structures, and each switched capacitor array comprises three branches that form an array of binary-weighted capacitors, and each branch comprises a capacitor with an individual capacitance, a switch coupled to the capacitor in cascade, and a multiplexer for controlling the switch, as described above. Furthermore, in the embodiment, a quantity of the control signals is 4, e.g. $CNT_1$, $CNT_2$, $CNT_3$ and $CNT_4$. In each switched capacitor array, each multiplexer is used to selectively provide a most significant bit control signal $CNT_1$ or other control signal ($CNT_2$, $CNT_3$ or $CNT_4$) to control the switch according to the select signal SEL, wherein the most significant bit control signal $CNT_1$ is used to provide a most significant bit capacitance.

Figure 4A:
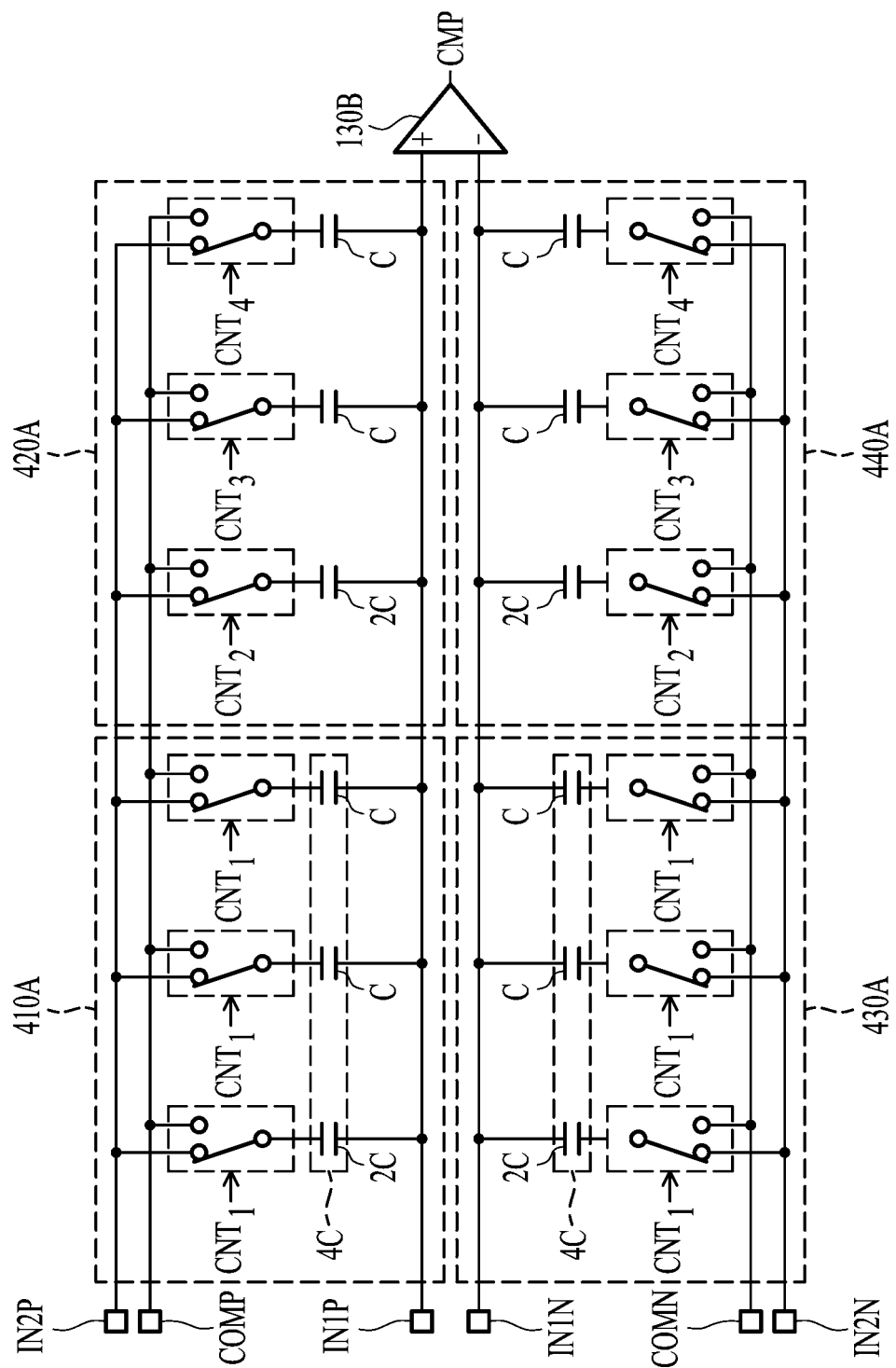
FIG. 4A shows a schematic illustrating an equivalent circuit of the DAC of FIG. 3 during a $K^{th}$ sampling period.
Figure 4B:
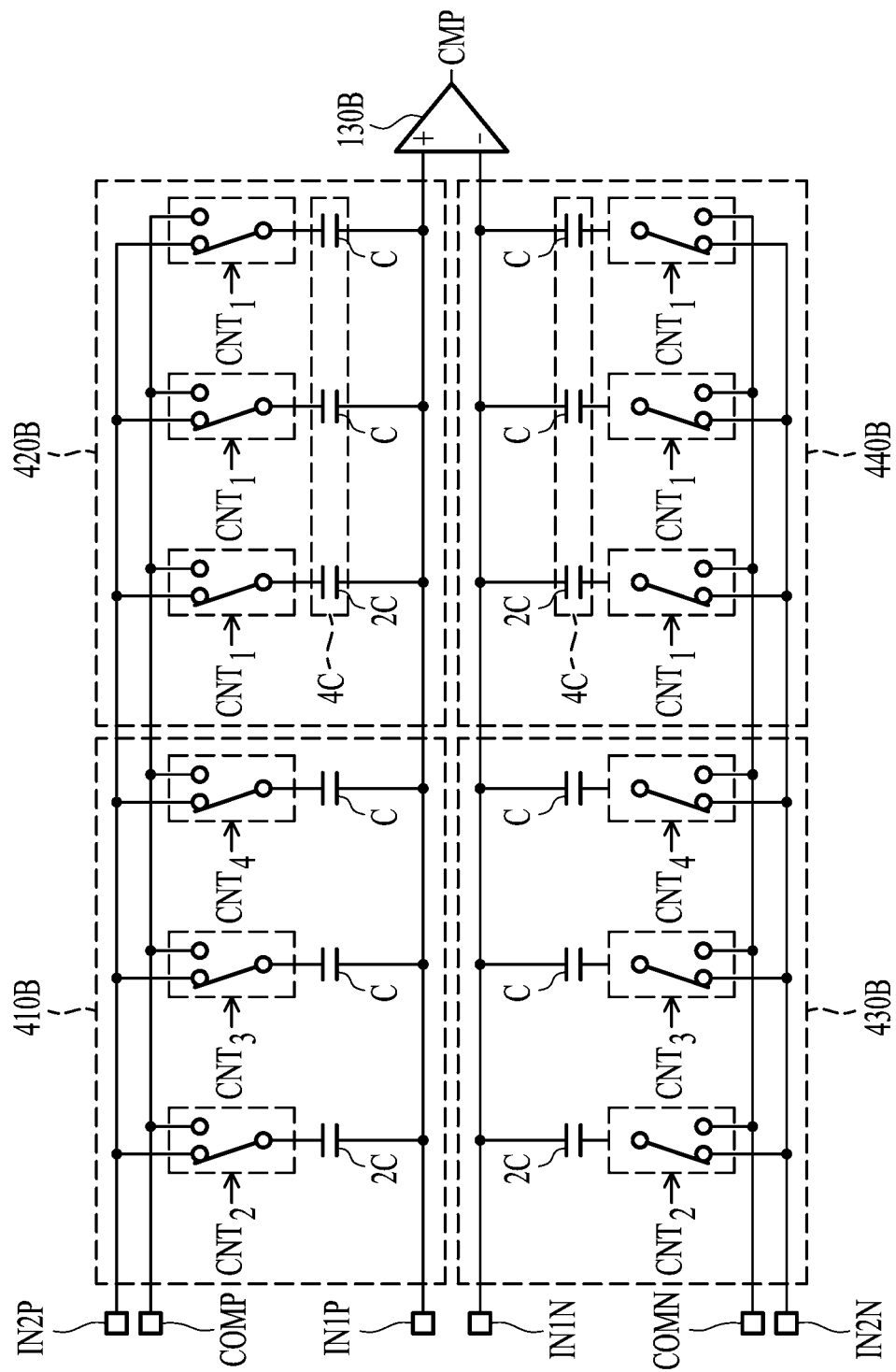
FIG. 4B shows a schematic illustrating an equivalent circuit of the DAC of FIG. 3 during a $(K+1)^{th}$ sampling period.

FIG. 4A and FIG. 4B show an execution of a capacitor swapping operation of the DAC 300 of FIG. 3 according to an embodiment of the invention. FIG. 4A shows a schematic illustrating an equivalent circuit of the DAC 300 of FIG. 3 during a $K^{th}$ sampling period, and FIG. 4B shows a schematic illustrating an equivalent circuit of the DAC 300 of FIG. 3 during a $(K+1)^{th}$ sampling period. During the $K^{th}$ sampling period, the $K^{th}$ sampled analog differential signals $S_{SH+}$ and $S_{SH-}$ are input to the input terminals IN1P and IN1N, respectively, and the reference signal $S_{ref}$ is input to the input terminals IN2P and IN2N. Furthermore, a reference voltage different from the reference signal $S_{ref}$ is input to the common terminals COMP and COMN. Referring to FIG. 3 and FIG. 4A together, in the switched capacitor arrays 310 and 330 of FIG. 3, the select signal SEL from the SAR logic 140 of FIG. 1 controls all multiplexers (i.e. $MUX_{11}$, $MUX_{12}$, MUM, $MUX_{13}$, $MUX_{32}$ and $MUX_{33}$) to provide the most significant bit control signal $CNT_1$ to all switches (i.e. $SW_{11}$, $SW_{12}$, $SW_{13}$, $SW_{31}$, $SW_{32}$ and $SW_{33}$), which results in the equivalent circuits 410A and 430A. Therefore, in each of the circuits 410A and 430A, the capacitor 4C is a most significant capacitor of the DAC 300, which is equal to the sum of the capacitors of a switched capacitor array, i.e. $4C=C_{11}+C_{12}+C_{13}=C_{31}+C_{32}+C_{33}$. Furthermore, in the switched capacitor arrays 320 and 340 of FIG. 3, the select signal SEL from the SAR logic 140 of FIG. 1 controls all multiplexers (i.e. $MUX_{21}$, $MUX_{22}$, $MUX_{23}$, $MUX_{41}$, $MUX_{42}$ and $MUX_{43}$) to provide the control signals other than the most significant bit control signal $CNT_1$ (i.e. $CNT_2$, $CNT_3$, $CNT_4$) to the switches (i.e. $SW_{21}$, $SW_{22}$, $SW_{23}$, $SW_{41}$, $SW_{42}$ and $SW_{43}$), which results in the equivalent circuits 420A and 440A. The capacitor $C_{11}$ of the switched capacitor array 310, the capacitor $C_{21}$ of the switched capacitor array 320, the capacitor $C_{31}$ of the switched capacitor array 330 and the capacitor $C_{41}$ of the switched capacitor array 340 have capacitances which equal to a half of the most significant capacitor 4C, which results in the capacitors 2C of the circuits 410A, 420A, 430A and 440A, i.e. $2C=C_{11}=C_{21}=C_{31}=C_{41}=4C/2$. In addition, the capacitors $C_{12}$ and $C_{13}$ of the switched capacitor array 310, the capacitors $C_{22}$ and $C_{23}$ of the switched capacitor array 320, the capacitors $C_{32}$ and $C_{33}$ of the switched capacitor array 330 and the capacitor $C_{42}$ and $C_{43}$ of the switched capacitor array 340 have capacitances which equal to a half of the capacitor 2C, which results in the capacitors C of the circuits 410A, 420A, 430A and 440A, i.e. $C=C_{12}=C_{13}=C_{22}=C_{23}=C_{32}=C_{33}=C_{42}=C_{43}$. Specifically, each capacitor provides an individual capacitance.

Figure 5:
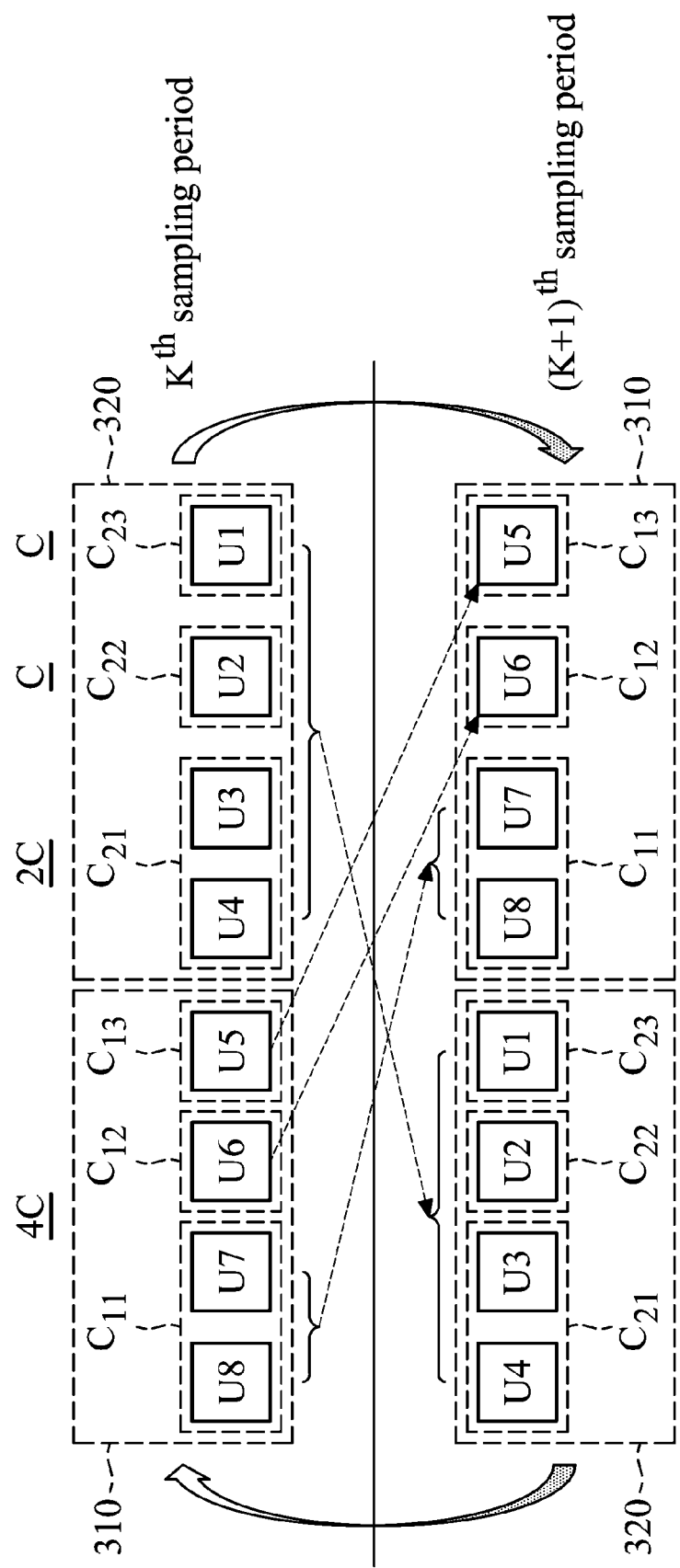
FIG. 5 shows a schematic illustrating the capacitor swapping operations in the switched capacitor arrays of FIG. 3.

Referring to FIG. 5, FIG. 5 shows a schematic illustrating the capacitor swapping operations in the switched capacitor arrays 310 and 320 of FIG. 3. Due to the swapping operations of the switched capacitor arrays 310 and 320 and the swapping operations of the switched capacitor arrays 330 and 340 being the same, FIG. 5 only shows the swapping operations of the switched capacitor arrays 310 and 320 in order to simplify the descriptions. Referring to FIGS. 3, 4A and 5 together, each capacitor of the switched capacitor arrays 310 and 320 is composed of unit capacitors, wherein the unit capacitor is a least significant bit capacitance for the DAC 300. In the switched capacitor array 310, the capacitors $C_{12}$ and $C_{13}$ are composed of the unit capacitors U6 and U5, respectively, and the capacitor $C_{11}$ is composed of the two unit capacitors U7 and U8. In the switched capacitor array 320, the capacitors $C_{23}$ and $C_{22}$ are composed of the unit capacitors U1 and U2, respectively, and the capacitor $C_{21}$ is composed of the two unit capacitors U3 and U4. Therefore, during the $K^{th}$ sampling period, a most significant bit capacitance 4C is provided by all capacitors of the switched capacitor array 310 (i.e. 4C=U8+U7+U6+U5) and other capacitances smaller than the most significant bit capacitance are provided by different capacitors of the switched capacitor array 320 (i.e. 2C=U4+U3, C=U2 and C=U1) for the non-inverting input terminal of the comparator 130B. Similarly, the most significant bit capacitance 4C is provided by all capacitors of the switched capacitor array 330 and other capacitances smaller than the most significant bit capacitance are provided by different capacitors of the switched capacitor array 340 for the inverting input terminal of the comparator 130B. Thus, according to the capacitances, the DAC 300 of FIG. 3 converts the control signals $CNT_1$ to $CNT_4$ to obtain the intermediate analog signal $S_{IA}$ during the $K^{th}$ sampling period. In the embodiment, the DAC 300 of FIG. 3 is a 3-bit DAC, and a quantity of the significant bit capacitances is 3, e.g. C, 2C and 4C.

Next, during the $(K+1)^{th}$ sampling period, the $(K+1)^{th}$ sampled analog differential signals $S_{SH+}$ and $S_{SH-}$ are input to the input terminals IN1P and IN1N, respectively, and the reference signal $S_{ref}$ is input to the input terminals IN2P and IN2N. Referring to FIG. 3 and FIG. 4B together, in the switched capacitor arrays 320 and 340 of FIG. 3, the select signal SEL from the SAR logic 140 of FIG. 1 controls the all multiplexers (i.e. $MUX_{21}$, $MUX_{22}$, $MUX_{23}$, $MUX_{41}$, $MUX_{42}$ and $MUX_{43}$) to provide the most significant bit control signal $CNT_1$ to all switches (i.e. $SW_{21}$, $SW_{22}$, $SW_{23}$, $SW_{41}$, $SW_{42}$ and $SW_{43}$), which results in the equivalent circuits 420B and 440B. Therefore, in each of the circuits 420B and 440B, the capacitor 4C is a most significant capacitor of the DAC 300. Furthermore, in the switched capacitor arrays 310 and 330 of FIG. 3, the select signal SEL from the SAR logic 140 of FIG. 1 controls all multiplexers (i.e. $MUX_{11}$, $MUX_{12}$, MUM, $MUX_{31}$, $MUX_{32}$ and $MUX_{33}$) to provide the control signals other than the most significant bit control signal $CNT_1$ (i.e. $CNT_2$, $CNT_3$, $CNT_4$) to the switches (i.e. $SW_{11}$, $SW_{12}$, $SW_{13}$, $SW_{31}$, $SW_{32}$ and $SW_{33}$), which results in the equivalent circuits 410B and 430B. The relationships of the capacitors are described above. Referring to FIGS. 3, 4B and 5 together, during the $(K+1)^{th}$ sampling period, a most significant bit capacitance 4C is provided by all capacitors of the switched capacitor array 320 (i.e. 4C=U4+U3+U2+U1) and other capacitances smaller than the most significant bit capacitance are provided by different capacitors of the switched capacitor array 310 (i.e. 2C=U8+U7, C=U6 and C=U5) for the non-inverting input terminal of the comparator 130B. Similarly, the most significant bit capacitance 4C is provided by all capacitors of the switched capacitor array 330 and other capacitances smaller than the most significant bit capacitance are provided by different capacitors of the switched capacitor array 340 for the inverting input terminal of the comparator 130B. Thus, according to the capacitances, the DAC 300 of FIG. 3 converts the control signals $CNT_1$ to $CNT_4$ to obtain the intermediate analog signal $S_{IA}$ during the $(K+1)^{th}$ sampling period.

In a conventional SAR ADC that uses a most significant capacitor to provide a most significant bit capacitance, because of capacitor mismatch, a middle code error occurs when a MSB transition occurs, such as the digital input is around "1000 . . . " to "0111 . . . " or vice versa. Compared with a conventional SAR ADC, the most significant bit capacitance of the embodiments is provided by a plurality of capacitors based on a capacitor swapping operation. Assuming that a converted result of a $K^{th}$ sampled analog signal is $S_{Dout}+S_{error}$, where $S_{Dout}$ represents a digital output signal of the ADC and $S_{error}$ represents a middle code error. By swapping the capacitors, a converted result of a $(K+1)^{th}$ sampled analog signal is $S_{Dout}-S_{error}$. Therefore, an average effect without $S_{error}$ is obtained, i.e. $(S_{Dout}+S_{error}+S_{Dout}-S_{error})/2=S_{Dout}$, thus the middle code error is suppressed under statistical means. In FIG. 4A and FIG. 4B, alternatively swapping the capacitors of the switched capacitor arrays is used as an example, and does not limit the invention. In other embodiments, the SAR logic 140 of FIG. 1 may provide the select signal SEL to randomly swap the capacitors of the switched capacitor arrays. Furthermore, due to the middle code error caused by capacitor mismatch being correlated, the differential nonlinearity (DNL) and integral nonlinearity (INL) of the ADC are improved, thereby enhancing linearity. In a better embodiment, the DNL and INL are improved by 0.707 ($=\sqrt{2}/2$). Since INL is improved, spurious free dynamic range response (SFDR) is improved as well. Specifically, by splitting a most significant capacitor into a plurality of sub-capacitors, a capacitor swapping operation is performed by the SAR ADC of the invention, to alternatively or randomly swap the capacitors of the SAR ADC. Furthermore, only a few multiplexes and some simple logic devices (e.g. switches, flip-flops) are required to complete the swap logic circuit of the capacitor swapping operation, thus design of the swap logic circuit is not seriously effected. Compared with a conventional SAR ADC, according to the embodiments of the invention, smaller capacitors are used to achieve the same accuracy, thereby area and power of the SAR ADCs of the embodiments are reduced. In other words, conventionally required capacitances are reduced while linearity of the SAR ADCs of the embodiments remains the same.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A successive approximation register (SAR) analog to digital converter (ADC) for converting an analog input signal into a digital output signal, comprising:
  a digital to analog converter, having an input terminal for receiving the analog input signal and an output terminal for providing an intermediate analog signal according to the analog input signal, a most significant bit capacitance and a plurality of significant bit capacitances smaller than the most significant bit capacitance, and comprising:
    a first switched capacitor array coupled to the input and output terminals of the digital to analog converter, selectively providing the most significant bit capacitance or the significant bit capacitances according to a select signal, wherein the sum of the significant bit capacitances is equal to the most significant bit capacitance; and
    a second switched capacitor array coupled to the input and output terminals of the digital to analog converter, providing the significant bit capacitances when the first switched capacitor array provides the most significant bit capacitance, and providing the most significant bit capacitance when the first switched capacitor array provides the significant bit capacitances;
  a comparator, providing a comparison result according to the intermediate analog signal; and
  a SAR logic, providing the digital output signal according to the comparison result.

2. The SAR ADC as claimed in claim 1, wherein each of the first and second switched capacitor arrays comprises a plurality of binary-weighted capacitors, and the SAR logic further provides the select signal to the first and second switched capacitor arrays, so as to control the first and second switched capacitor arrays to alternatively or randomly provide the most significant bit capacitance.

3. The SAR ADC as claimed in claim 1, wherein the SAR logic further provides a plurality of control signals to the first and second switched capacitor arrays, respectively, wherein the control signals comprises a most significant bit control signal.

4. The SAR ADC as claimed in claim 3, wherein each of the first and second switched capacitor arrays comprises a plurality of branches, wherein each branch comprises:
  a capacitor coupled to the input and output terminals of the digital to analog converter;
  a switch coupled to the capacitor; and
  a multiplex, selectively providing the most significant bit control signal or one of the other control signals to control the switch according to the select signal, such that the switch selectively provides a first reference signal or a second reference signal to the capacitor.

5. The SAR ADC as claimed in claim 4, wherein the digital to analog converter is a N-bit digital to analog converter, and a quantity of the significant bit capacitances is N.

6. The SAR ADC as claimed in claim 5, wherein a quantity of the control signals is (N+1) and a quantity of the branches is N.

7. The SAR ADC as claimed in claim 5, wherein each capacitor provides an individual capacitance of the N capacitances.

8. The SAR ADC as claimed in claim 5, wherein each of the N capacitances is a multiple of unit capacitances, and the unit capacitance is a least significant bit capacitance.

9. A conversion method for a successive approximation register (SAR) analog to digital converter (ADC) having a digital to analog converter and a SAR logic, comprising:
  selectively providing a most significant bit capacitance or a plurality of significant bit capacitances smaller than the most significant bit capacitance according to a select signal by a first switched capacitor array of the digital to analog converter;
  providing the most significant bit capacitance by a second switched capacitor array of the digital to analog converter when the significant bit capacitances are provided by the first switched capacitor array;
  providing the significant bit capacitances by the second switched capacitor array when the most significant bit capacitance is provided by the first switched capacitor array;

obtaining an intermediate analog signal according to an analog input signal, the most significant bit capacitance and the significant bit capacitances;

providing a comparison result according to the intermediate analog signal; and providing a digital output signal according to the comparison result by the SAR logic.

10. The conversion method as claimed in claim 9, wherein each of the first and second switched capacitor arrays comprises a plurality of binary-weighted capacitors, and the SAR logic further provides the select signal to the first and second switched capacitor arrays, so as to control the first and second switched capacitor arrays to alternatively or randomly provide the most significant bit capacitance.

11. The conversion method as claimed in claim 9, wherein the digital to analog converter has an input terminal for receiving the analog input signal and an output terminal for providing the intermediate analog signal, wherein the first switched capacitor array is coupled to the input and output terminals of the digital to analog converter, and the second switched capacitor array is coupled to the input and output terminals of the digital to analog converter.

12. The conversion method as claimed in claim 11, wherein the SAR logic further provides a plurality of control signals to the first and second switched capacitor arrays, respectively, wherein the control signals comprises a most significant bit control signal.

13. The conversion method as claimed in claim 12, wherein each of the first and second switched capacitor arrays comprises a plurality of branches, wherein each branch comprises:

a capacitor coupled to the input and output terminals of the digital to analog converter;

a switch coupled to the capacitor; and a multiplex, selectively providing the most significant bit control signal or one of the other control signals to control the switch according to the select signal, such that the switch selectively provides a first reference signal or a second reference signal to the capacitor.

14. The conversion method as claimed in claim 13, wherein the digital to analog converter is a N-bit digital to analog converter, and a quantity of the significant bit capacitances is N.

15. The conversion method as claimed in claim 14, wherein a quantity of the control signals is (N+1) and a quantity of the branches is N.

16. The conversion method as claimed in claim 14, wherein each capacitor provides an individual capacitance of the N capacitances.

17. The conversion method as claimed in claim 14, wherein each of the N capacitances is a multiple of unit capacitances, and the unit capacitance is a least significant bit capacitance.

* * * * *